United States Patent
Li et al.

(10) Patent No.: US 10,528,515 B2
(45) Date of Patent: Jan. 7, 2020

(54) MEMORY CHANNEL DRIVER WITH ECHO CANCELLATION

(71) Applicant: Intel Corporation, Santa Clara, CA (US)

(72) Inventors: Qin Li, Folsom, CA (US); Changhong Lin, Cupertino, CA (US); James A. McCall, Portland, OR (US); Harry Muljono, San Ramon, CA (US)

(73) Assignee: Intel Corporation, Santa Clara, CA (US)

( * ) Notice: Subject to any disclaimer, the term of this patent is extended or adjusted under 35 U.S.C. 154(b) by 103 days.

(21) Appl. No.: 15/634,991

(22) Filed: Jun. 27, 2017

(65) Prior Publication Data

US 2018/0373665 A1     Dec. 27, 2018

(51) Int. Cl.
| | |
|---|---|
| *G06F 13/40* | (2006.01) |
| *G11C 7/12* | (2006.01) |
| *G11C 7/22* | (2006.01) |
| *H04B 3/23* | (2006.01) |
| *G06F 13/16* | (2006.01) |

(52) U.S. Cl.
CPC ...... *G06F 13/4072* (2013.01); *G06F 13/1689* (2013.01); *G11C 7/12* (2013.01); *G11C 7/22* (2013.01); *H04B 3/23* (2013.01); *H04B 3/231* (2013.01)

(58) Field of Classification Search
None
See application file for complete search history.

(56) References Cited

U.S. PATENT DOCUMENTS

| | | | | |
|---|---|---|---|---|
| 6,430,606 B1 * | 8/2002 | Haq | ............... | H03K 19/018585 709/208 |
| 7,373,114 B2 * | 5/2008 | Yagyu | ...................... | H04B 3/02 315/244 |
| 8,643,973 B2 * | 2/2014 | Mukhopadhyay | ..... | G11B 5/022 360/46 |
| 8,664,972 B2 * | 3/2014 | Murayama | ........... | G06F 13/1668 326/30 |
| 8,737,492 B1 * | 5/2014 | Cirit | ......................... | H04B 3/20 375/257 |
| 2003/0067888 A1 * | 4/2003 | Bina | ......................... | H04B 3/23 370/286 |
| 2003/0234664 A1 * | 12/2003 | Yamagata | ................ | G11C 7/10 326/30 |
| 2005/0116361 A1 * | 6/2005 | Fukui | .................... | G11C 11/412 257/1 |

(Continued)

OTHER PUBLICATIONS

Extended European Search Report for Patent Application No. 18174453.3 , dated Dec. 6, 2018 , 8 pages.

*Primary Examiner* — Kaushikkumar M Patel

(74) *Attorney, Agent, or Firm* — Compass IP Law PC

(57) ABSTRACT

An apparatus is described that includes a memory channel driver circuit having first driver circuitry to drive a data signal on a memory channel and second driver circuitry to drive an echo cancellation signal on the memory channel. The echo cancellation signal includes echo cancellation pulses that follow corresponding pulses of the data signal by an amount of time that causes the echo cancellation pulses to reduce reflections of the corresponding pulses of the data signal at a memory device that is coupled to the memory channel.

19 Claims, 10 Drawing Sheets

(56) References Cited

U.S. PATENT DOCUMENTS

| | | | |
|---|---|---|---|
| 2006/0022713 A1* | 2/2006 | Tokuhiro | H03K 19/0005 326/87 |
| 2006/0156139 A1* | 7/2006 | Rohrbaugh | G01R 31/3172 714/738 |
| 2007/0192051 A1 | 8/2007 | Izumi | |
| 2007/0247185 A1* | 10/2007 | Oie | H04L 25/0298 326/30 |
| 2007/0288669 A1* | 12/2007 | Greeff | G06F 13/4086 710/100 |
| 2010/0020584 A1* | 1/2010 | Xu | G11C 5/04 365/63 |
| 2013/0049848 A1 | 2/2013 | Uemura et al. | |
| 2015/0294712 A1* | 10/2015 | Kikuchi | G11C 5/063 365/52 |
| 2016/0248574 A1* | 8/2016 | Zhou | H04L 5/1461 |
| 2016/0285483 A1* | 9/2016 | Ke | H04B 1/0475 |
| 2016/0301393 A1* | 10/2016 | Jung | H03K 3/012 |

* cited by examiner

MEMORY CHANNEL DRIVER WITH ECHO CANCELLATION

FIELD OF INVENTION

The field of invention pertains generally to the electronic arts, and, more specifically, to a memory channel driver with echo cancellation.

BACKGROUND

With each new memory channel generation there is typically an increase in clock frequency and/or a decrease in transmitted voltage amplitudes. As a consequence, there is an increased risk of corruption within the communication that transpires between a memory controller and the memory devices that are coupled to the memory controller through the memory channel. System designers, therefore, are very focused on developing memory channel designs that ensure that data that is driven on the memory channel is correctly received by its intended recipient on the memory channel.

FIGURES

A better understanding of the present invention can be obtained from the following detailed description in conjunction with the following drawings, in which.

DETAILED DESCRIPTION

Figure 1A:
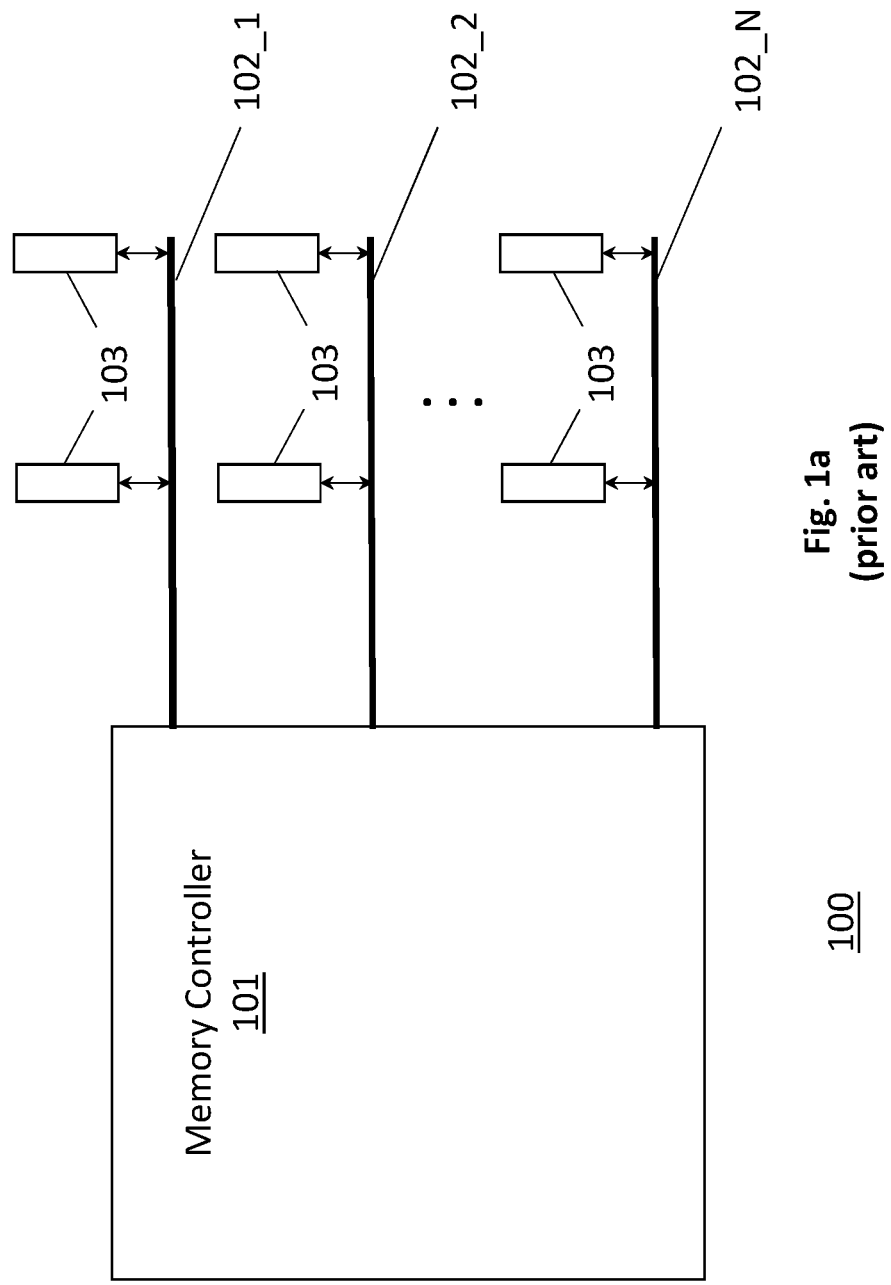
FIG. 1a shows a memory subsystem.

FIG. 1a shows a prior art memory sub-system 100 that includes a memory controller 101, multiple memory channels 102_1 through 102_N and respective dual in-line memory modules (DIMMs) 103 that are plugged into the memory channels 102. As observed in FIG. 1a, two DIMMs are coupled into each of the memory channels. Various embodiments of the memory subsystem of FIG. 1a is referred to as 2 DIMMs Per Channel (2DPC). With each new memory channel generation there is typically an increase in clock frequency and/or a decrease in voltage level and an associated, increased risk of data corruption errors.

Figure 1B:
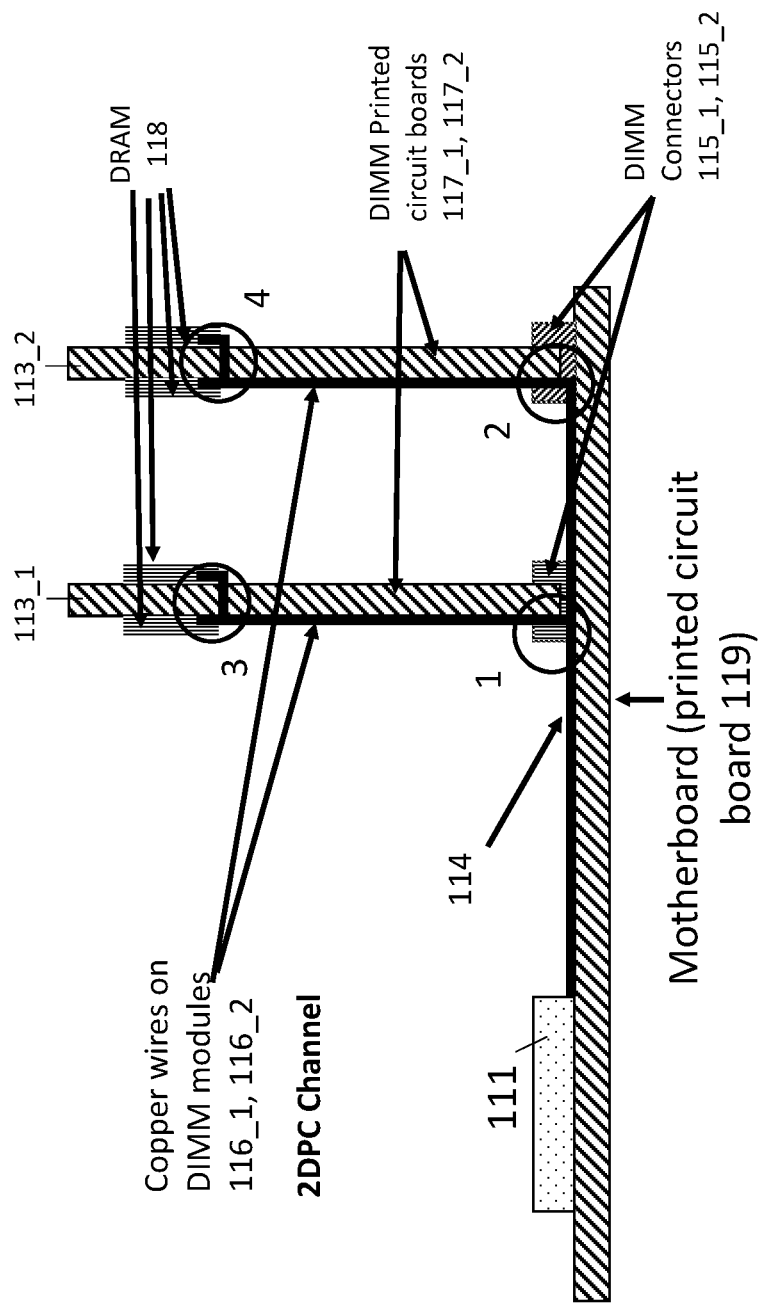
FIG. 1b shows a physical cross section of a memory subsystem.

FIG. 1b shows a more detailed view of a cross section of the physical layout for a 2DPC memory channel. As observed in FIG. 1b, the memory channel is terminated at one end by the semiconductor chip 111 that the memory controller is integrated within. The memory channel includes conductive (copper) wiring 114 disposed on the Printed Circuit Board (PCB) 119 of, e.g., a computing system motherboard. Two connectors 115_1, 115_2 are mounted on the surface of the PC board 119 and a pair of DIMMs 113_1, 113_2 are respectively plugged into the pair of connectors 115_1, 115_2. The physical memory channel extends as conductive (copper) wiring 116_1, 116_2 disposed on, e.g., the respective PC boards 117_1, 117_2 of the DIMMs 113_1, 113_2. The copper wiring 116_1, 116_2 on each DIMM terminates at the dynamic random access memory (DRAM) devices 118 that are populated on the DIMMs.

High speed data channels, such as the memory channel of FIG. 1b, are sensitive to characteristic impedance mismatches that exist along the channel. As is known in the art, so long as the characteristic impedance remains constant along a channel, the full energy of the signal propagates along the channel. However if there a change in the characteristic impedance of the channel, some percentage of the signal energy continues to propagate down the channel and a remaining percentage is reflected and propagates in the opposite direction (e.g., towards the transmitter that transmitted the signal).

Figure 2:
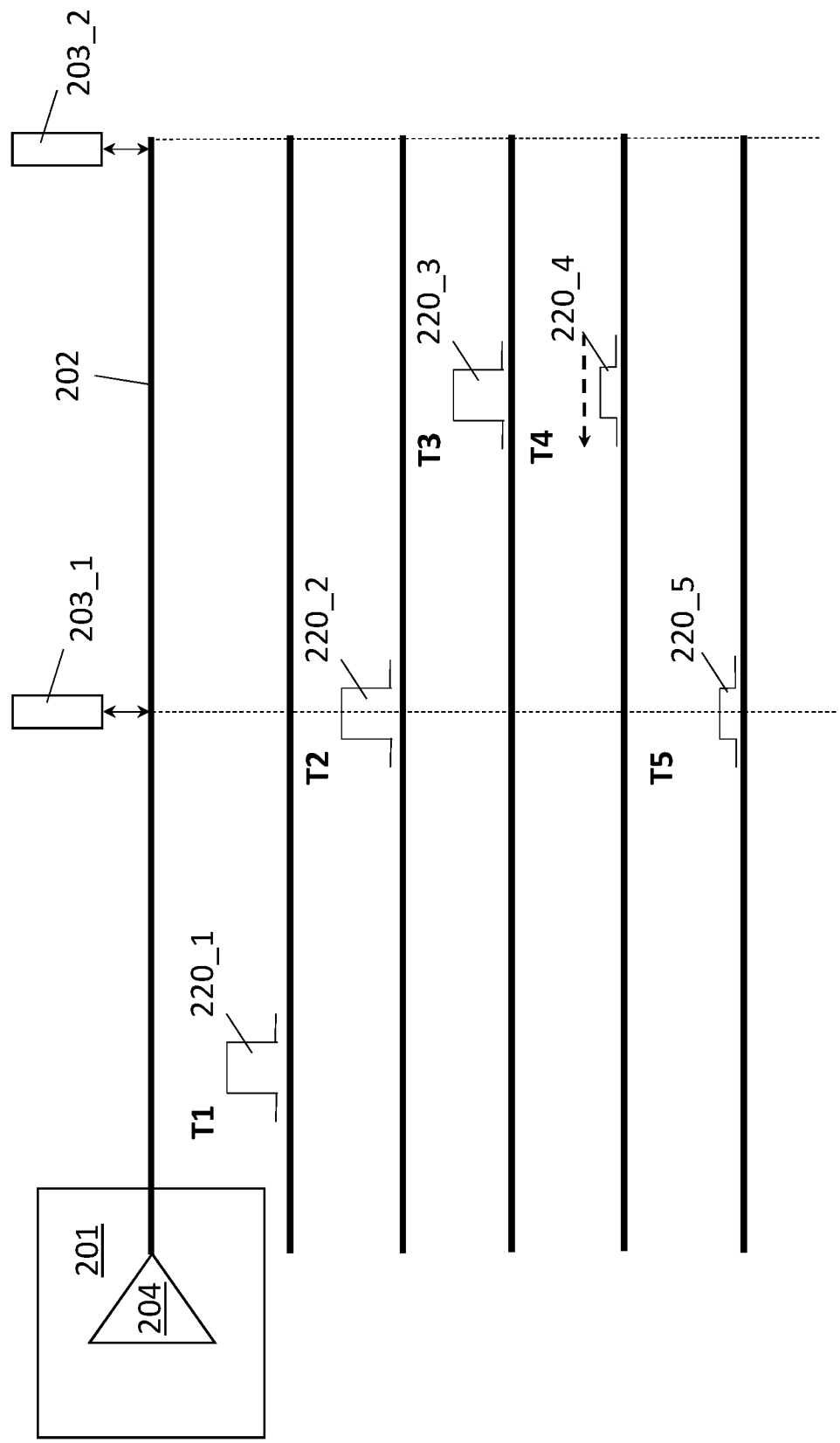
FIG. 2 shows a reflection on a memory channel.

A channel's characteristic impedance is defined by its physical features such as the dimensions of its conductive material and the types of material(s) that are used for its conductor(s) and surrounding/neighboring dielectric(s). As such, referring to FIG. 1b, typically, the characteristic impedance of the channel as disposed on the main PC board 114 and the PC boards 117_1, 117_2 of the DIMMs. However, physically abrupt changes are present in any of points 1, 2, 3 and 4 in FIG. 1b which generally corresponds to a change in characteristic impedance and therefore a source of reflection. That is, reflections within the channel can arise from any of points 1, 2, 3 and 4 of FIG. 1b FIG. 2 shows a simple schematic and electrical timing diagram model for a memory channel 202 having two DIMMs 203_1, 203_2 where reflections from point 2 of FIG. 1b are more prevalent than other reflections within the channel. The selection of point 2 as the prevalent source of reflection for the model of FIG. 2 is for ease of drawing and explanation. Here, according to one study of one particular implementation, reflections from point 4 were observed to be prevalent. Reflections from points other than point 2 (including point 4) or multiple points are discussed in more detail further below.

As observed at time T1, a transmitter 204 within the memory controller 201 launches a pulse 220_1 that is to be received by the first DIMM 203_1. As observed at time T2, the pulse 220_2 arrives at the first DIMM 203_1 and is sampled by the first DIMM 203_1. The pulse 220_3, however, continues to propagate down the channel 202 toward the second DIMM 203_2 as observed at time T3.

Eventually, the pulse 220_3 reaches the second DIMM 203_2 at the end of the channel 202. Owing to an impedance mismatch that exists between the channel 202 and the second DIMM 203_2 (point 2), a reflected pulse 220_4 propagates back toward the memory controller 201 from the end of the channel 202 as observed at time T4. Eventually, at time T5, the reflected pulse 220_5 reaches the first DIMM 203_1.

According to a typical mode of operation, the memory controller 201 activates a select line within the memory channel 202 (not shown in FIG. 2) that activates one DRAM on the first DIMM 203_1 but not the second DIMM 203_2 so that a DRAM of the first DIMM 203_1 samples the pulse 220_2 at time T2 but the second DIMM 203_2 does not sample the pulse 220_3 when it reaches the second DIMM 203_2 after time T3 (for simplicity, in the instant example, propagation delay within a DIMM is ignored such that an activated DRAM is assumed to sample a pulse as soon as it reaches its corresponding DIMM). Unfortunately, the activation of the DRAM of the first DIMM 203_1 could cause the DRAM of the first DIMM 203_1 to sample or improperly receive the reflected pulse 220_5 at time T5 as an unintended/undesired data pulse. The reflected pulse 220_5 can therefore be viewed as noise that has the potential to interfere with the correct reception of data by the DRAM of the first DIMM 203_1.

Figure 3:
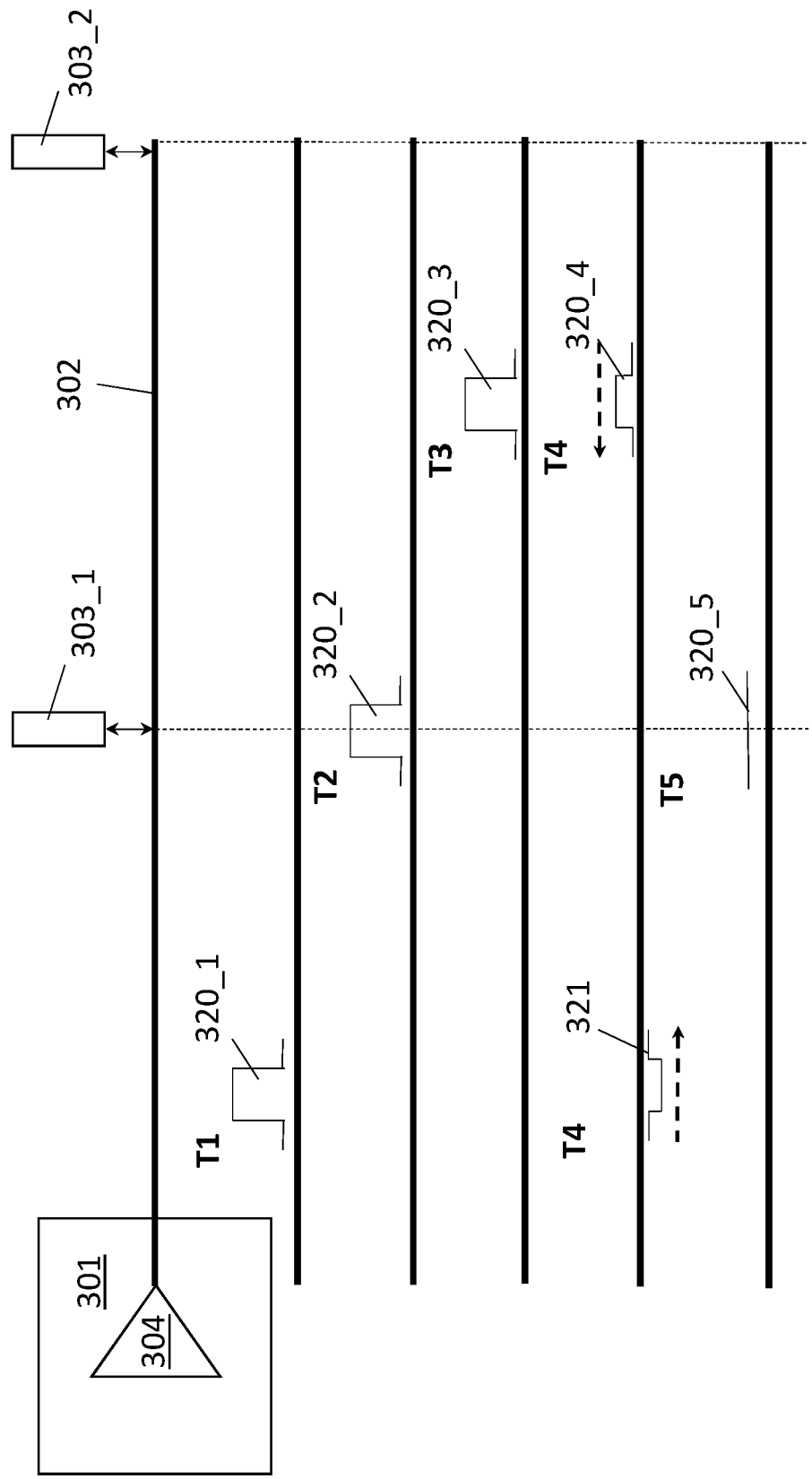
FIG. 3 shows a scheme to cancel a reflection on a memory channel

FIG. 3 shows the operation of an improved memory controller transmitter 304 that is designed to inject an echo cancellation pulse 321 after the main data pulse 320. The echo cancellation pulse 321 has the effect of canceling out the reflected pulse 220_5 of FIG. 2 from the perspective of the DRAM of the first DIMM 303_1. Times T1 through T3 depict operation that is identical to times T1 through T3 of FIG. 2. As observed at time T4, however, the transmitter emits an echo cancellation pulse 321. Here, it is pertinent to recognize that the memory devices on the DIMM cards may be traditional volatile main memory devices (e.g., DRAM), or, may be composed of emerging non volatile main memory technologies that, e.g., have access times that are sufficiently smaller than traditional non volatile memory (e.g., traditional FLASH) to be used for main memory and/or are accessible at finer granularity than traditional (sector or block accessible) mass storage devices such as cache line granularity and/or being byte addressable. Examples include, to name a few possibilities, memory devices that use chalcogenide glass, multi-threshold level NAND flash memory, NOR flash memory, single or multi-level Phase Change Memory (PCM), a resistive memory, nanowire memory, ferroelectric transistor random access memory (FeTRAM), anti-ferroelectric memory, magnetoresistive random access memory (MRAM) memory that incorporates memristor technology, resistive memory including the metal oxide base, the oxygen vacancy base and the conductive bridge Random Access Memory (CB-RAM), or spin transfer torque (STT)-MRAM, a spintronic magnetic junction memory based device, a magnetic tunneling junction (MTJ) based device, a DW (Domain Wall) and SOT (Spin Orbit Transfer) based device, a thiristor based memory device, or a combination of any of the above, or other memory. The memory device may refer to the die itself and/or to a packaged memory product.

Note that the polarity of the amplitude (negative) of the echo cancellation pulse 321 is opposite the polarity of the original pulse's amplitude (positive). Here, although not shown, the channel is terminated with a reference voltage and resistance network where polarity is defined in relation to the reference voltage (a signal above the reference voltage has positive polarity and a signal beneath the reference voltage has negative polarity). At time T5, the echo cancellation pulse 321 reaches the first DIMM 303_1 at the same moment that the reflected pulse 320_4 reaches the first DIMM 303_1 and has the effect of cancelling out the reflected pulse 320_4 at the first DIMM 303_1.

The amount of time T4-T1 that elapses after the transmission of the initial pulse 320_1 at time T1 until the echo cancellation pulse 321 is transmitted at time T4 corresponds to the difference between the propagation time for the reflection of the initial main pulse 320_1 to reach the first DIMM 301 after transmission of the initial pulse 320_1 by the transmitter 304 and the propagation time for the echo cancellation pulse 321 to reach the first DIMM 303_1 after its transmission by the transmitter 304. In the particular example of FIG. 3, the echo cancellation pulse 321 is transmitted after the original main pulse 320_1 has already reflected from the second DIMM 303_2.

This is only exemplary, however. In other embodiments the echo cancellation pulse 321 may be transmitted before the main pulse is reflected. Here, the aforementioned propagation time for the reflected main pulse 320 to reach the first DIMM 303_1 is a function of the distance between the memory controller 301 and the second DIMM 303_2, and, the distance between the second DIMM 303_2 and the first DIMM 303_1. By contrast, the aforementioned propagation time for the echo cancellation pulse 321 to reach the first DIMM 303_1 is a function of the distance between the memory controller 301 and the first DIMM 303_1. As such, different layout arrangements of the channel 302 and the devices (DIMMS, memory controller) that connect to the channel 302 can affect the precise timing of when the echo cancellation pulse 321 should be transmitted after transmission of the original main pulse 320_1 in order to cancel out the reflection of the original pulse at the first DIMM 303_1.

Likewise, the appropriate amplitude of the echo cancellation pulse 321 to sufficiently cancel out the reflected original pulse can also vary. Here, ideally, the echo cancellation pulse and the reflected original pulse have the same amplitude (but opposite polarity) when both reach the first DIMM 303_1. Generally, the amplitude of the original pulse and its reflection will attenuate as it propagates through the channel 302 and its shape will become more rounded rather than square because its higher frequency components are more greatly attenuated than its lower frequency components (not shown in FIG. 3 for illustrative ease).

Additionally, the amplitude of the reflection 320_4 is a function of the impedance mismatch that exists between the channel 302 and the second DIMM 303_1 (the reflected pulse's amplitude approaches that of the incident pulse as the two impedances become more disparate). Thus, the amplitude of the reflected pulse when it reaches the first DIMM 303_1 is a function of the distance from the memory controller 301 to the second DIMM 303_2, the distance between the second DIMM 303_2 and the first DIMM 303_1 and the impedance mismatch between the channel and the second DIMM 303_2.

Also, the amplitude of the echo cancellation pulse 321 attenuates as it propagates down the channel 302. Thus, the amplitude of the echo cancellation pulse 321 when it reaches the first DIMM 303_1 is a function of the distance between the memory controller 301 and the first DIMM 303_1. As with the timing between the two pulses, the respective amplitudes of the reflected and echo cancellation pulses are a function of the layout arrangement of the memory channel and the devices that connect to it.

Because of the many variables that affect the correct timing and amplitude of the echo cancellation pulse 321, in various embodiments, the transmitter 304 is designed to "train" itself, e.g., during bring-up and/or power-on-reset by, e.g., writing test patterns to the first DIMM while varying both timing of emission and amplitude of the echo cancellation pulse 321. The timing of emission and amplitude settings for the echo cancellation pulse 321 that result in fewest errors at the first DIMM 303_1 is then chosen as the proper echo cancellation pulse setting.

Here, referring back to FIG. 1*b*, consider a more detailed example in which the simplifications that were made with respect to FIGS. 2 and 3 are not present. That is, e.g., if reflections from point 4 are more prevalent than all other reflections, the training will optimize to cancel the reflection from point 4 which, e.g., may cause the echo cancellation pulse to be delayed as compared to another implementation in which the prevalent reflections are from point 2 (a reflected pulse from point 4 takes longer to reach the first DIMM 113_1 than a reflected pulse from point 2). Is still yet other implementations reflections from point 4 may be more prevalent but reflections from point 2 are non-negligible which may cause the training to settle on an echo pulse amplitude and delay that best cancels the combination of reflections from points 2 and 4. Also note that the echo cancellation pulse may cancel the reflected wave at point 2 or point 3 depending on what the training operation determines yields the best overall channel performance.

Figure 4:
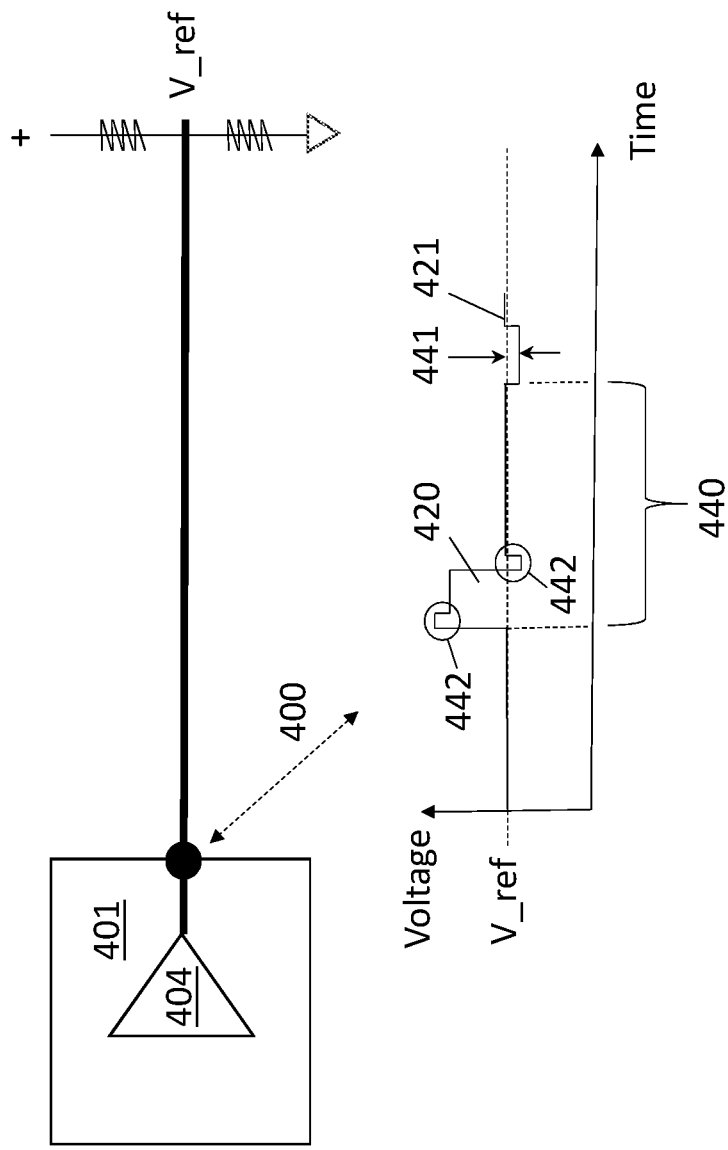
FIG. 4 shows a driven waveform that includes an echo cancellation signal.

As such, referring to FIG. 4 which shows an exemplary waveform 400 that is transmitted by the memory controller transmitter 404. Both the delay 440 after the transmission of the initial pulse 420 that is incurred prior to transmission of the echo cancellation pulse 421 and the amplitude 441 of the echo cancellation pulse 421 can be adjusted by the transmitter 404. Note that the exemplary waveform 400 of FIG. 4 also includes pre-emphasis 442 or "overshoot" of the rising and falling edges of the main pulse 420. Here, as is known in the art, pre-emphasis 442 is the injection of extra higher frequency signal energy (or elimination of low frequency signal energy) into a transmitted pulse in order to compensate for the more rapid attenuation of the pulse's higher frequencies as compared to its lower frequencies (a pulse signal is understood to include many different frequencies). By the time the pulses reach their destination, ideally, the amplitudes of the higher frequency signal components have attenuated down to levels that result in properly shaped pulse.

Figure 5:
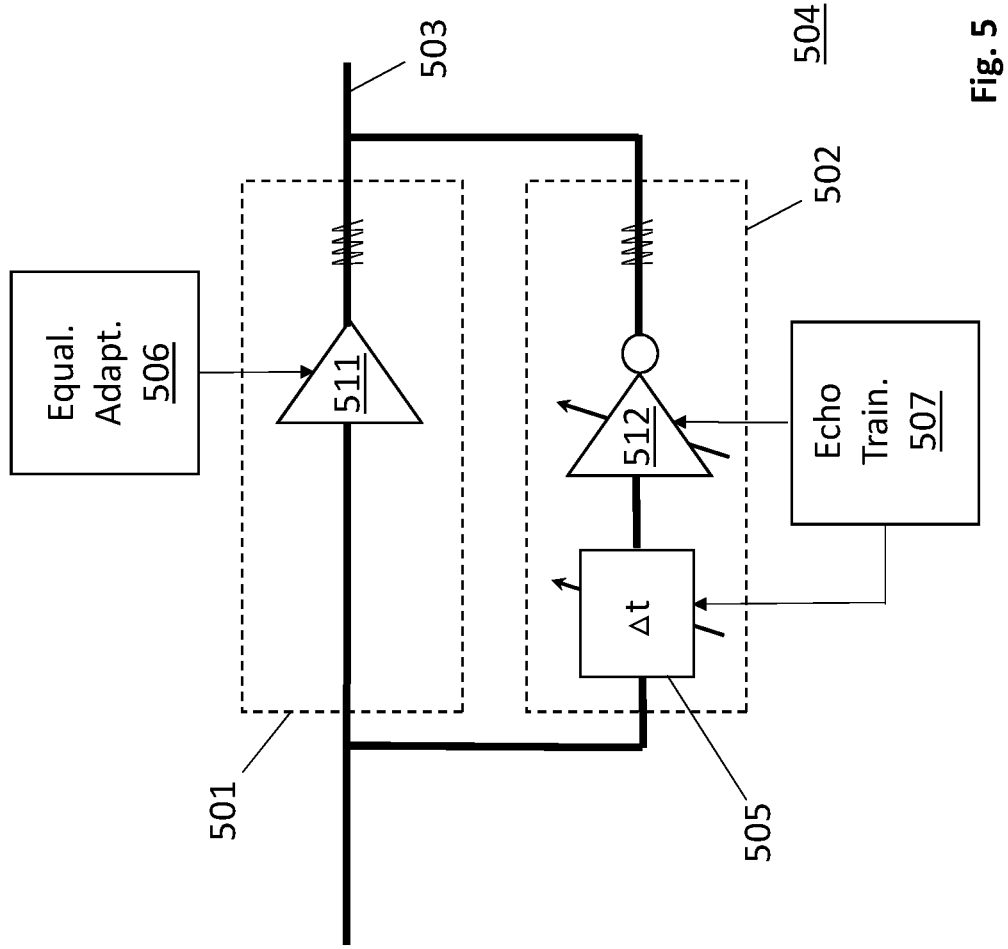
FIG. 5 shows a driver circuit to drive a data signal and an echo cancellation signal.

FIG. 5 shows a high level view of a transmitter circuit 504 that is capable of creating a waveform as described just above. In various embodiments, the transmitter 504 is integrated into the memory controller so that the data pulses and corresponding echo cancellation can be launched from the memory controller. As can be seen in FIG. 5 the transmitter 504 is composed of a first channel 501 that includes an, e.g., traditional driver 511 that is responsible for driving the initial main pulse. In various embodiments, driver 511 is also designed to impart pre-emphasis on the main pulse. The transmitter 504 also includes a second channel 502 having a second driver 512 that is responsible for driving the echo cancellation signal. Drivers 511 and 512 may be voltage and/or current drivers depending on designer preference and/or the surrounding application. A voltage driver places a voltage on the output, whereas, a current driver pushes/sinks currents to/from the output.

As observed in FIG. 5, both channels 501, 502 receive as an input signal the digital data stream to be driven over the channel 503. The driver 512 of the echo cancellation channel 502 is designed to drive a signal of opposite polarity as compared to the reflection noise caused by corresponding signal driven by the first driver 511. Additionally, the echo cancellation channel 502 is designed to impart variable delay and amplitude to the input signal in order to effect the correct timing and amplitude of the echo cancellation signal. Here, a variable delay circuit 505 effects the correct delay adjustment. The gain of the second driver 512 is also adjustable to set the amplitude of the echo cancellation signal.

In various embodiments, both the first driver 511 and the second driver 512 may undergo "training" during bring-up, power-on-reset and/or reset of the memory channel, memory controller and/or system (e.g., computing system) that the memory controller is a component within. According to one embodiment, the first driver 511 is trained to set the appropriate pre-emphasis (or more generally, equalization adaptation) settings for the main data signal according to any of a number of mechanisms that are known in the art. As such, equalization adaptation circuitry 506 is coupled to the first driver 511. A more detailed example of how pre-emphasis settings are implemented is provided further below with respect to FIG. 6. In combined or alternative embodiments, the second driver 512 is trained to set the appropriate delay and amplitude of the echo cancellation signal. As such, echo cancellation training circuitry 507 is observed being coupled to both the variable delay circuit 505 and the second driver 512.

According to one training embodiment, the first driver 511 is initially trained to set the pre-emphasis settings for the main data signal (e.g., without any echo cancellation pulse). Then, after the pre-emphasis settings have been determined for the first driver 511, the second driver 512 is trained to determine the correct delay and amplitude of the echo cancellation signal. In one embodiment, the training includes transmitting data signals from the main driver 511 and varying the amplitude of the echo cancellation signal while keeping the delay of the echo cancellation signal fixed. The process then repeats for a next delay and continues in this manner until a complete range of delays have been tested.

The best combination of delay and amplitude for the echo cancellation signal may be determined, e.g., by one or more DRAMs or other circuitry of the first DIMM providing feedback concerning the highest quality observed eye pattern and/or determining a bit error rate on the training data. In the case of the later, the data signals that were sent during echo cancellation may have been composed of a known pattern to one or more DRAMs or other circuitry of the DIMM so that the DIMM can determine the bit error rate and/or the data signals that were sent during echo cancellation training may be have been written into the memory devices of the DIMM and subsequently read by the memory controller which performs the bit error rate calculation.

Once the second driver 512 has been trained, according to various embodiments, the first driver 511 is retrained again (e.g., with echo cancellation) to establish a new set of pre-emphasis settings and the second driver 512 is retrained again to establish a new set of echo cancellation settings. The process of retraining driver 511 and then driver 512 may then continually repeat until their respective settings converge. That is, each new setting should correspond to a smaller percentage change than the immediately prior setting. Once new settings are observed to be of negligible change for both pre-emphasis and echo cancellation the training is complete.

Figure 6:
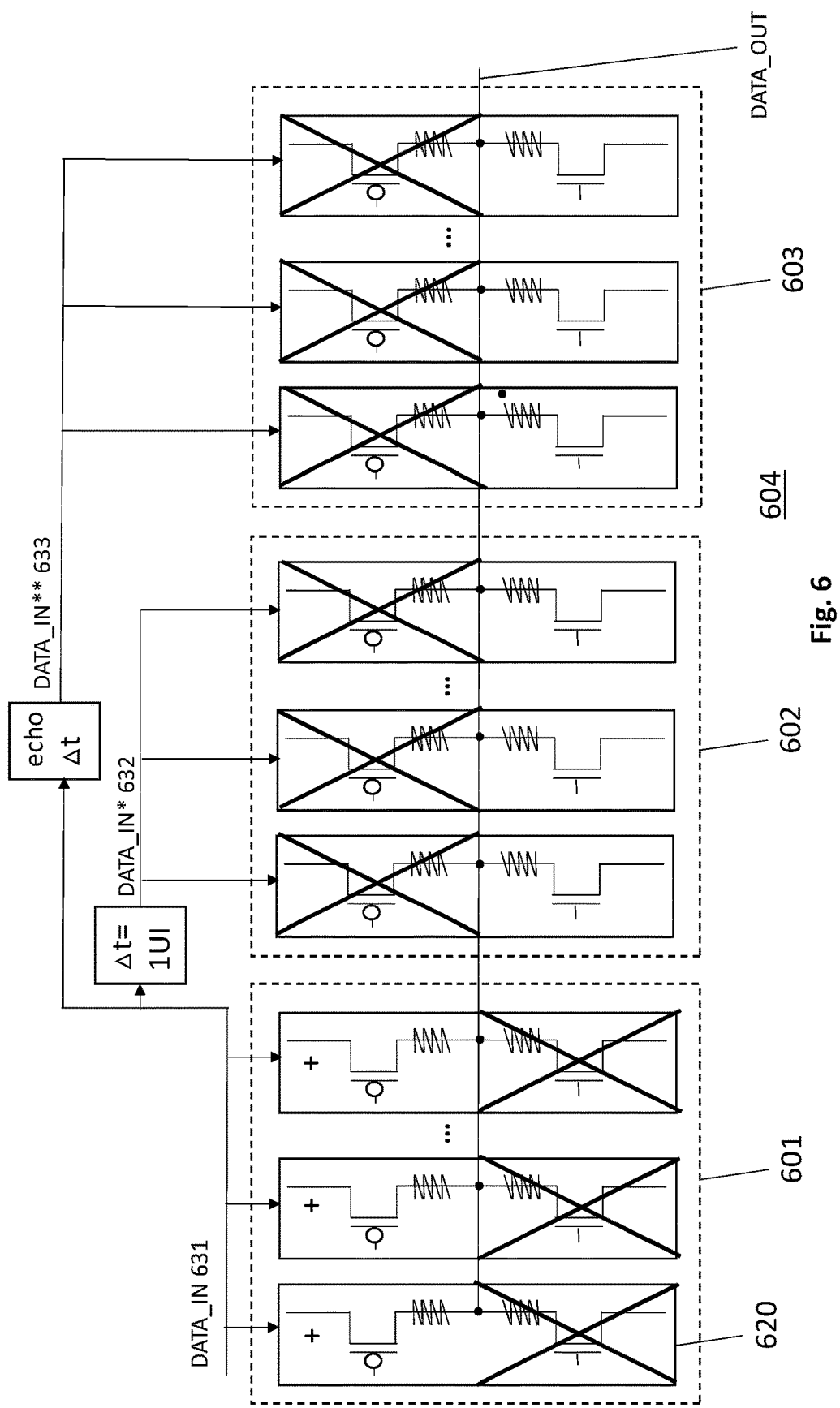
FIG. 6 shows a more detailed embodiment of a driver circuit that can drive a data signal and an echo cancellation signal.

FIG. 6 shows one possible embodiment 604 of the output driving end of the transmitter 504 of FIG. 5. As observed in FIG. 6, the output driving end 604 includes a plurality of pull-up/pull-down legs 620 (only one such pull-up/pull-down leg is labeled in FIG. 6 for illustrative ease). Here, a first subset of the legs (e.g., subset 601) is used to generate the main data pulses, a second subset of the legs (e.g., subset 602) is used to implement de-emphasis (which is a technique used to effect pre-emphasis) and a third subset of the legs (e.g., subset 603) is used to implement the echo cancellation circuit. Here, subsets 601 and 602 can together be viewed as an embodiment of driver 511 (or portion thereof) and subset 603 can be viewed as an embodiment of driver 512 (or portion thereof). For simplicity, logic circuitry that feeds and controls the input signals that are provided to the pull-up/pull-down legs and the voltage supplies and associated circuitry that the pull-up/pull-down legs are coupled between is not shown in FIG. 6.

Figure 7:
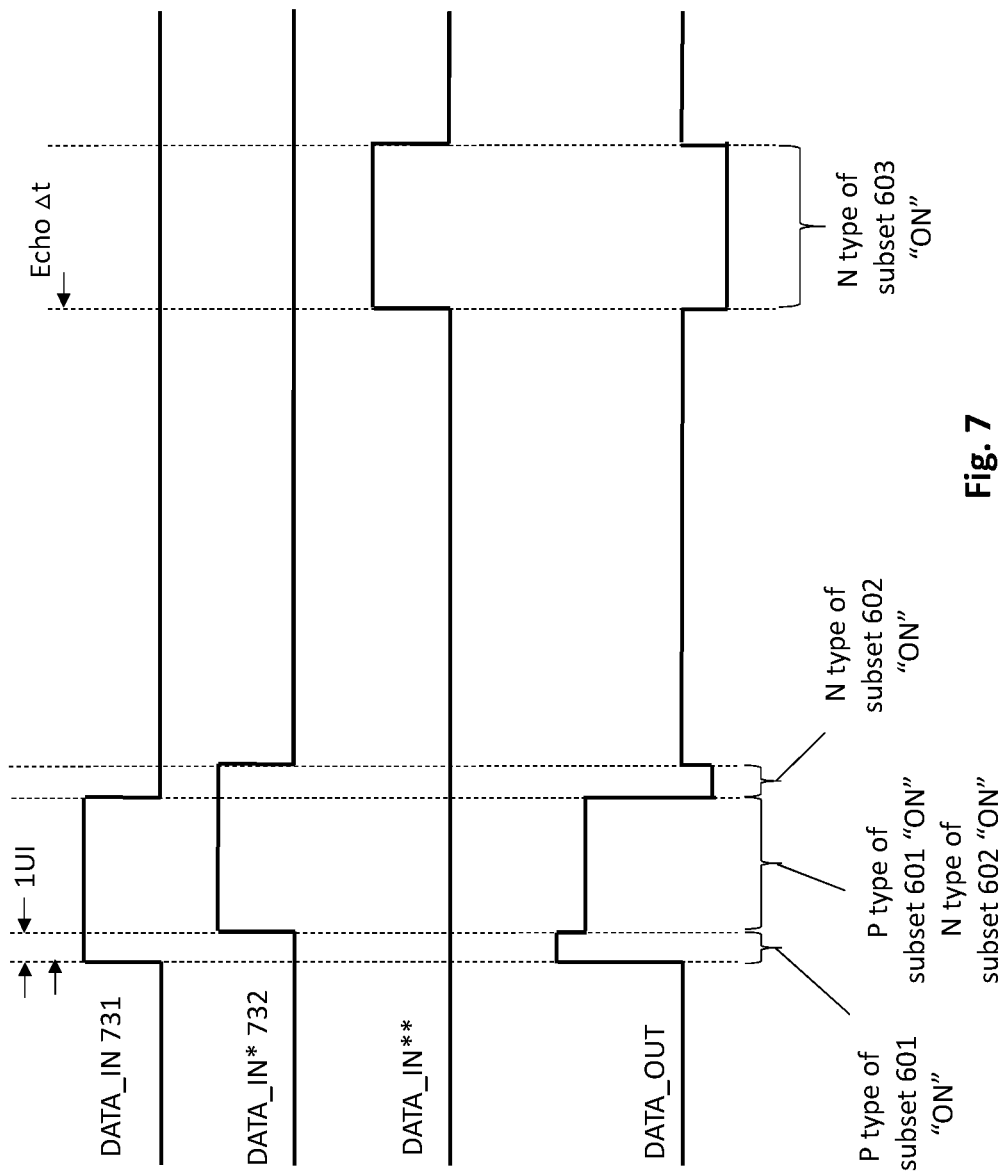
FIG. 7 shows possible waveforms for the driver circuit of FIG. 6.

FIG. 7 depicts one way in which the transmitter 604 of FIG. 6 may operate. A digital input signal, DATA_IN 731, corresponds to the digital signal that is to be driven over the memory channel and is provided to the first subset of legs 601 that generates a nominal output signal (the output signal without de-emphasis). According to the embodiments of FIGS. 6 and 7, the individual P type transistor or N type transistor of any pull-up/pull-down leg can be disabled and the pull-up/pull-down leg will activate whichever transistor remains enabled when the input signal is a logic high. Here, referring to FIG. 6, the N type transistors of subset 601 are disabled, thus, the P type transistors are enabled when the DATA_IN 731 signal is a logic high.

A slightly delayed version of the main input signal, DATA_IN* 732, is provided to the second subset 602 of legs to effect de-emphasis. In the particular embodiments of FIGS. 6 and 7 the slight delay is a one unit interval ("1UI") delay which may correspond, e.g., to the pulse width or clock cycle time of a higher frequency clock than the clock rate at which the data signals are being transmitted over the channel. Only N type transistors of the second subset 602 are enabled thus the N type transistors of the second subset 602 will be "on" when the DATA_IN* signal 732 is a logic high. Here, during the 1UI delay, the P type transistors of the first subset 601 are "on" while the N type transistors of the second subset are "off" (during the delay, DATA_IN* is not yet a logic high). After the 1UI delay has elapsed, the N type transistors of the second subset 602 switch to "on" which drops the level of the output signal DATA_OUT to a lower level. The drop to a lower level is referred to as de-emphasis and is a technique for creating pre-emphasis in the output signal as observed in FIG. 7.

Eventually the DATA_IN signal 731 drops to a logic low which turns off the P type transistors of subset 601 but the N type transistors of subset 602 remain "on" because of the 1UI delay in the input signal DATA_IN* 732 that is received by the second subset 602. 1UI after the DATA_IN signal 731 has fallen to a logic low, the P type transistors of subset 601 remain off and the N type transistors of subset 602 turn off. Here, with only the N type transistors of subset 602 being active during the 1UI delay after the falling edge of DATA_IN, followed by the same transistors being turned off after the falling edge of DATA_IN* 732 (1UI after the falling edge of DATA_IN), a pre-emphasis overshoot is created on the falling edge of the DATA_OUT signal.

The first and second subsets 601, 602 therefore effect the driver 511 of FIG. 5 that drives the main data signal on the channel. Note that in various embodiments, in order to properly implement the de-emphasis, the sizes of the transistors in the first subset 601 may be larger than the transistors in the second subset 602 and/or there may be more transistors in the first subset 601 than in the second subset 602. Additionally, FIG. 6 only shows those transistors within both subsets 601, 602 that are actually enabled. That is, both subsets 601, 602 may include more legs than the particular legs depicted in FIG. 6. Here, as part of the configuration of the driver (e.g., from training), a number of legs from both subsets 601, 602 are enabled (leaving other legs from both subsets disabled) and specific P or N type transistors within the enabled legs are enabled to establish the peak amplitude of the pre-emphasis overshoot and the lower, de-emphasized logic levels of the output signal.

The third subset 603 of legs is used to craft the echo cancellation pulse. Here, the input signal that is received by the third subset, DATA_IN, is a delayed by an amount that is longer than the 1UI delay that is provided to the de-emphasis (second) subset 602. Additionally, the amplitude of the echo cancellation signal is typically smaller than the amplitude of the main data signal. As such, the third subset 603 may include fewer activated legs than either or both of the first and second subsets 601, 602 and/or the legs of the third subset 603 include smaller transistors than either or both of the first and second subsets 601, 602. Finally, since the echo cancellation signal is a negative amplitude signal, the P type transistors of the third subset 603 are disabled and the N type transistors of the third subset are enabled 603. That is, when the DATA_IN is logic high, the N type transistors of the third subset 603 are on.

In extended embodiments a fourth subset of legs could be added to provide pre-emphasis to the echo cancellation signal much the same way that subset 602 provides pre-emphasis to the main signal driven by subset 601. If such pre-emphasis is added to the echo cancellation signal note that the P type transistors of the fourth subset of legs would be enabled because the echo cancellation signal is an inverted signal (has negative amplitude driven by N type transistors).

The aforementioned memory channel driver approach is believed to be particularly pertinent for industry standard memory interface technologies such as various double data rate (DDR) technologies that may be published and/or standardized by the Joint Electron Device Engineering Council (JEDEC) Solid State Technology Association. Examples of such JEDEC standards include JESD79F for DDR SDRAM, JESD79-2F for DDR2 SDRAM, JESD79-3F for DDR3 SDRAM, JESD79-4A for DDR4 SDRAM, JESD209 for Low Power DDR (LPDDR), JESD209-2 for LPDDR2, JESD209-3 for LPDDR3, and JESD209-4 for LPDDR4 (these standards are available at www.jedec.org). Such standards (and similar standards) may be referred to as DDR-based standards and communication interfaces of the storage devices that implement such standards may be referred to as DDR-based interfaces.

Although embodiments described above have been written from the perspective of driver circuitry that is implemented on a memory controller, conceivably, similar driver circuitry could be integrated on a memory device to cancel out reflections that may be observed by a memory controller (e.g., in the case of a memory read operation).

Figure 8:
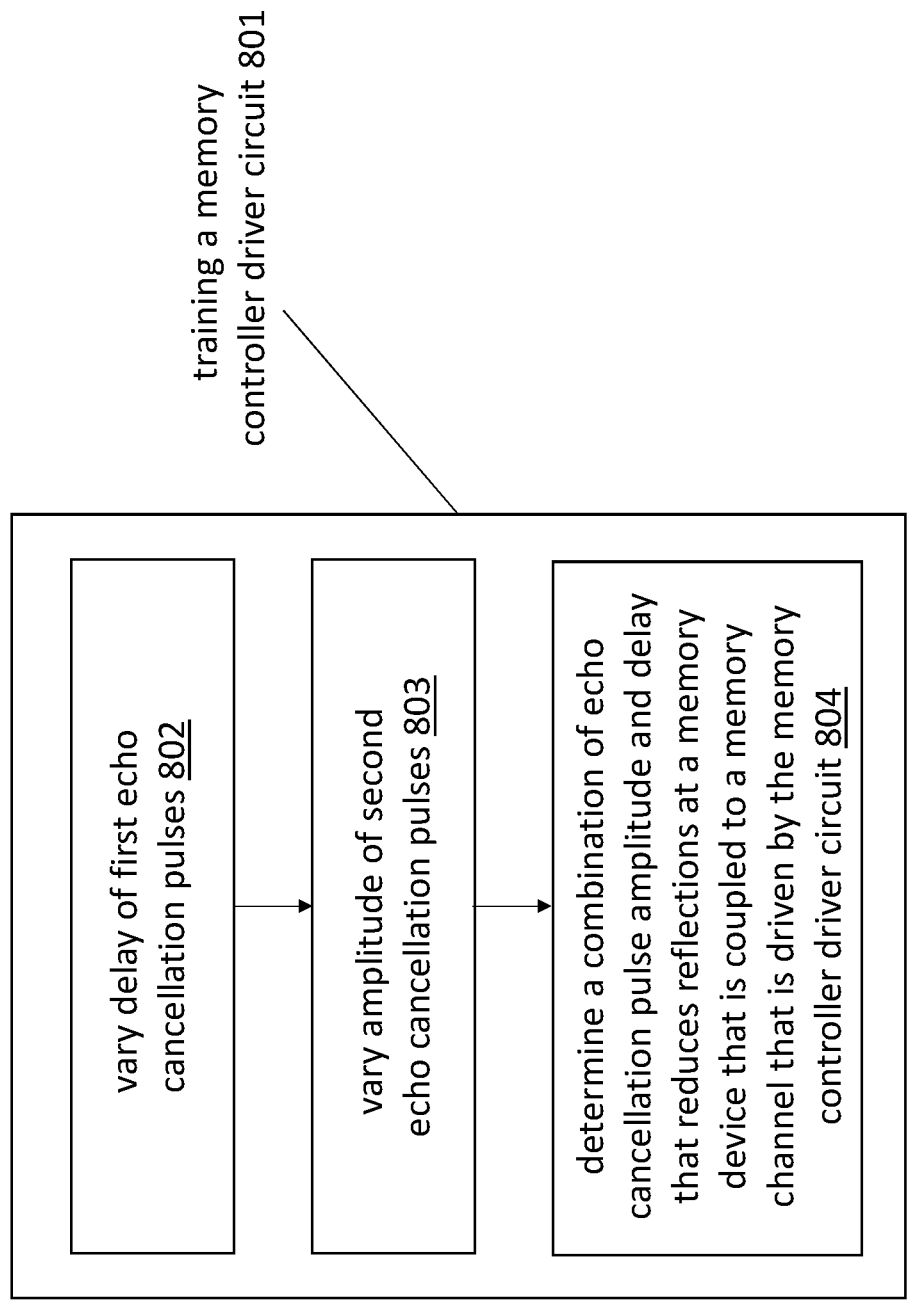
FIG. 8 shows a method of training a driver.

FIG. 8 shows a method described above. The method may be implemented, e.g., by BIOS firmware, memory channel driver program code, memory controller program code during any of power-up, power-on-reset, or reset of a memory controller or a computing system that the memory controller is integrated within. As observed in FIG. 8, the method includes training a memory controller driver circuit 801 by: varying delay of first echo cancellation pulses 802; varying amplitude of second echo cancellation pulses 803; and, determining a combination of echo cancellation pulse amplitude and delay that reduces reflections at a memory device that is coupled to a memory channel that is driven by said memory controller driver circuit 804.

Figure 9:
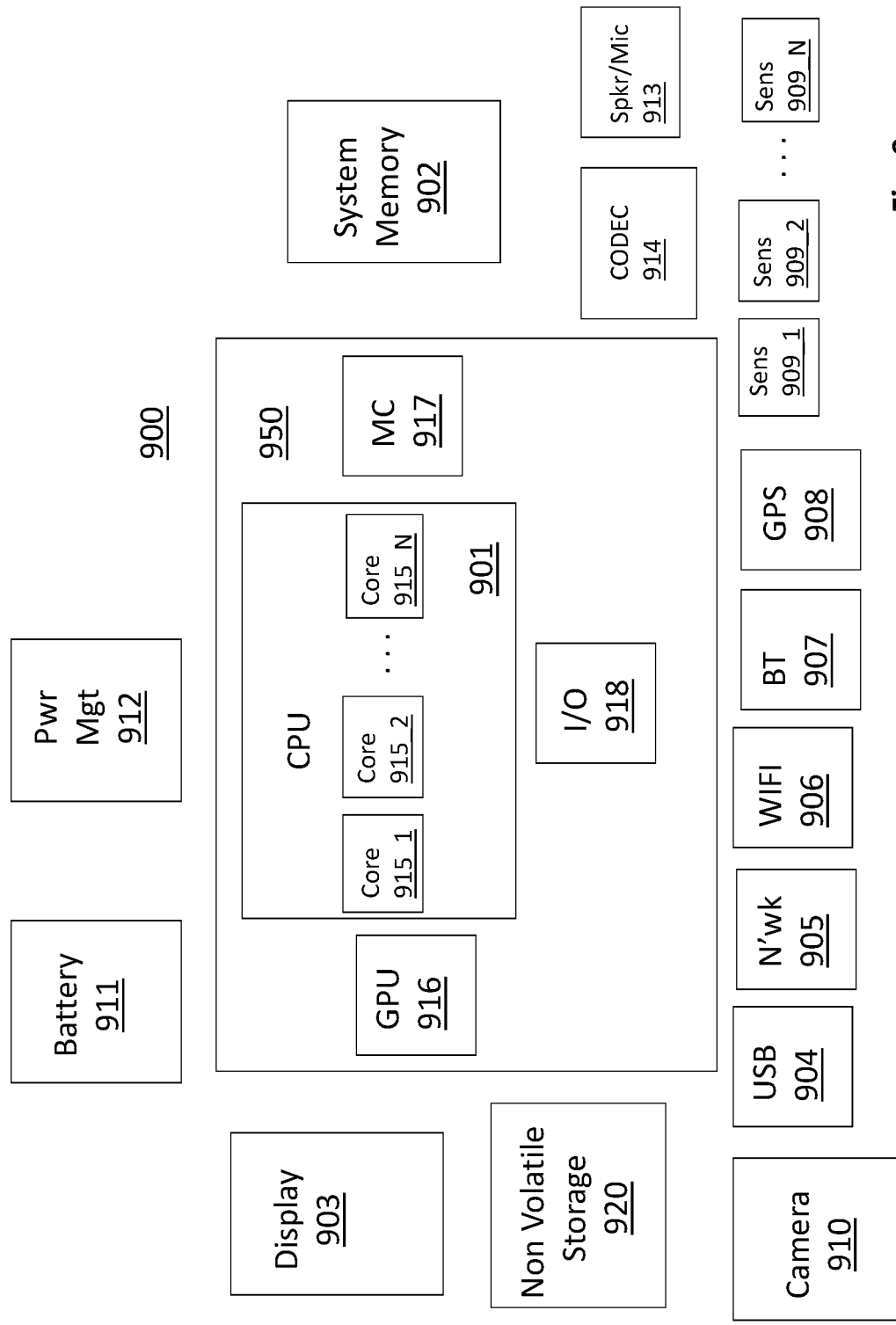
FIG. 9 shows a computing system.

FIG. 9 shows a depiction of an exemplary computing system 900 such as a personal computing system (e.g., desktop or laptop) or a mobile or handheld computing system such as a tablet device or smartphone, or, a larger computing system such as a server computing system.

As observed in FIG. 9, the basic computing system may include a central processing unit 901 (which may include, e.g., a plurality of general purpose processing cores and a main memory controller disposed on an applications processor or multi-core processor), system memory 902, a display 903 (e.g., touchscreen, flat-panel), a local wired point-to-point link (e.g., USB) interface 904, various network I/O functions 905 (such as an Ethernet interface and/or cellular modem subsystem), a wireless local area network (e.g., WiFi) interface 906, a wireless point-to-point link (e.g., Bluetooth) interface 907 and a Global Positioning System interface 908, various sensors 909_1 through 909_N (e.g., one or more of a gyroscope, an accelerometer, a magnetometer, a temperature sensor, a pressure sensor, a humidity sensor, etc.), a camera 910, a battery 911, a power management control unit 912, a speaker and microphone 913 and an audio coder/decoder 914.

An applications processor or multi-core processor 950 may include one or more general purpose processing cores 915 within its CPU 901, one or more graphical processing units 916, a memory management function 917 (e.g., a memory controller) and an I/O control function 918. The general purpose processing cores 915 typically execute the operating system and application software of the computing system. The graphics processing units 916 typically execute graphics intensive functions to, e.g., generate graphics information that is presented on the display 903. The memory control function 917, which may be referred to as a main memory controller or system memory controller, interfaces with the system memory 902. The system memory 902 may be a multi-level system memory. The interface between the memory controller function 917 and the system memory 902 may be implemented with one or more memory channels having drivers with echo cancellation as described at length above.

Each of the touchscreen display 903, the communication interfaces 904-907, the GPS interface 908, the sensors 909, the camera 910, and the speaker/microphone codec 913, 914 all can be viewed as various forms of I/O (input and/or output) relative to the overall computing system including, where appropriate, an integrated peripheral device as well (e.g., the camera 910). Depending on implementation, various ones of these I/O components may be integrated on the applications processor/multi-core processor 950 or may be located off the die or outside the package of the applications processor/multi-core processor 950. Non volatile storage 920 may hold the BIOS and/or firmware of the computing system.

One or more various signal wires within the computing system, e.g., a data or address wire of a memory bus that couples the main memory controller to the system memory, may include a receiver that is implemented as decision feedback equalizer circuit that internally compensates for changes in electron mobility as described above.

Embodiments of the invention may include various processes as set forth above. The processes may be embodied in machine-executable instructions. The instructions can be used to cause a general-purpose or special-purpose processor to perform certain processes. Alternatively, these processes may be performed by specific hardware components that contain hardwired logic for performing the processes, or by any combination of programmed computer components and custom hardware components.

Elements of the present invention may also be provided as a machine-readable medium for storing the machine-executable instructions. The machine-readable medium may include, but is not limited to, floppy diskettes, optical disks, CD-ROMs, and magneto-optical disks, FLASH memory, ROMs, RAMs, EPROMs, EEPROMs, magnetic or optical cards, propagation media or other type of media/machine-readable medium suitable for storing electronic instructions. For example, the present invention may be downloaded as a computer program which may be transferred from a remote computer (e.g., a server) to a requesting computer (e.g., a client) by way of data signals embodied in a carrier wave or other propagation medium via a communication link (e.g., a modem or network connection).

The invention claimed is:

1. An apparatus, comprising:
a memory channel driver circuit comprising first driver circuitry to drive a data signal on a memory channel data wire and second driver circuitry to drive an echo cancellation signal on said memory channel data wire, said echo cancellation signal comprising echo cancellation pulses that follow corresponding pulses of said data signal on said memory channel data wire by an amount of time that causes said echo cancellation pulses to reduce reflections of said corresponding pulses of said data signal on said memory channel data wire at a memory device that is coupled to said memory channel data wire, the second driver circuitry to also generate echo cancellation training pulses in which delay is varied across a first set of the echo cancellation training pulses and amplitude is varied across a second, different set of the echo cancellation training pulses.

2. The apparatus of claim 1 wherein said memory device is a DIMM card.

3. The apparatus of claim 2 wherein said DIMM card is closest to said memory channel driver circuit on said memory channel data wire.

4. The apparatus or claim 1 wherein said memory channel driver circuit is integrated on a memory controller.

5. The apparatus of claim 1 wherein said memory channel driver circuit further comprises a delay circuit coupled to said second driver circuit, said delay circuit to receive said data signal, said delay circuit to delay said data signal by said amount of time.

6. The apparatus of claim 1 wherein said first and second driver circuits are comprised of respective parallel legs of P type and N type transistors.

7. The apparatus of claim 6 further comprising additional parallel legs of transistors to impart pre-emphasis on said data signal.

8. The apparatus of claim 1 further comprising training circuitry to determine an appropriate amplitude for said echo cancellation pulses and to determine said amount of time.

9. A computing system, comprising:
one or more processing cores;
a main memory;
a memory controller coupled to said main memory with a memory channel, said memory controller comprising a memory channel driver circuit, said memory channel driver circuit comprising first driver circuitry to drive a data signal on a data wire of said memory channel and second driver circuitry to drive an echo cancellation signal on said data wire, said echo cancellation signal comprising echo cancellation pulses that follow corresponding pulses of said data signal on said data wire by an amount of time that causes said echo cancellation pulses to reduce reflections of said corresponding pulses of said data signal on said data wire at a memory device that is coupled to said memory channel, the second driver circuitry to also generate echo cancellation training pulses in which delay is varied across a first set of the echo cancellation training pulses and amplitude is varied across a second, different set of the echo cancellation training pulses.

10. The computing system of claim 9 wherein said memory device is a DIMM card.

11. The computing system of claim 10 wherein said DIMM card is closest to said memory channel driver circuit on said memory channel.

12. The computing system or claim 9 wherein said memory channel driver circuit is integrated on a memory controller.

13. The computing system of claim 9 wherein said memory channel driver circuit further comprises a delay circuit coupled to said second driver circuit, said delay circuit to receive said data signal, said delay circuit to delay said data signal by said amount of time.

14. The computing system of claim 9 wherein said first and second driver circuits are comprised of respective parallel legs of P type and N type transistors.

15. The computing system of claim 14 further comprising additional parallel legs of transistors to impart pre-emphasis on said data signal.

16. A method, comprising:
   training a memory controller driver circuit by:
      varying delay across a first set of echo cancellation pulses;
      varying amplitude across a second, different set of echo cancellation pulses; and,
      determining a combination of echo cancellation pulse amplitude and delay that reduces reflections at a memory device that is coupled to a memory channel that is driven by said memory controller driver circuit.

17. The method of claim 16 wherein said memory device is a DIMM card.

18. The method of claim 17 wherein said DIMM card is closest to said memory controller driver circuit as compared to any other DIMM cards that are coupled to said memory channel.

19. The method of claim 16 wherein said method further comprising performing pre-emphasis training for data pulses that are driven by said memory controller driver circuit.

\* \* \* \* \*